(12) United States Patent
Chun

(10) Patent No.: US 10,678,471 B2
(45) Date of Patent: Jun. 9, 2020

(54) MEMORY CONTROLLER, MEMORY SYSTEM HAVING THE MEMORY CONTROLLER, AND OPERATING METHOD OF THE MEMORY CONTROLLER

(71) Applicant: SK hynix Inc., Gyeonggi-do (KR)

(72) Inventor: Dong Yeob Chun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/117,426

(22) Filed: Aug. 30, 2018

(65) Prior Publication Data

US 2019/0235786 A1 Aug. 1, 2019

(30) Foreign Application Priority Data

Feb. 1, 2018 (KR) ........................ 10-2018-0012916

(51) Int. Cl.
*G06F 3/06* (2006.01)

(52) U.S. Cl.
CPC .......... *G06F 3/0653* (2013.01); *G06F 3/0604* (2013.01); *G06F 3/0659* (2013.01); *G06F 3/0673* (2013.01)

(58) Field of Classification Search
CPC ..... G06F 3/0653; G06F 3/0659; G06F 3/0679
See application file for complete search history.

(56) References Cited

U.S. PATENT DOCUMENTS

| 7,406,572 B1 * | 7/2008 | Nguyen | G06F 13/1694 711/107 |
| 7,831,794 B2 * | 11/2010 | Ito | G06F 13/4234 711/167 |
| 2006/0020778 A1 * | 1/2006 | Edrington | G06F 13/1694 713/1 |
| 2006/0149859 A1 * | 7/2006 | Dubal | G06F 1/24 710/8 |
| 2008/0082750 A1 * | 4/2008 | Okin | G11C 5/04 711/115 |
| 2013/0067455 A1 * | 3/2013 | Miao | G06F 8/654 717/173 |
| 2014/0201473 A1 * | 7/2014 | Falanga | G06F 12/0246 711/154 |
| 2017/0315734 A1 * | 11/2017 | Porzio | G06F 9/4401 |

FOREIGN PATENT DOCUMENTS

| KR | 1020100108697 | 10/2010 |
| KR | 1020170086345 | 7/2017 |

* cited by examiner

*Primary Examiner* — Edward J Dudek, Jr.
(74) *Attorney, Agent, or Firm* — IP & T Group LLP

(57) ABSTRACT

There are provided a memory controller, a memory system having the memory controller, and an operating method of the memory controller. The memory controller includes a status check command determining section for checking a status check command supported by a memory device among a plurality of status check commands, and a status check performing section for performing a status check operation on the memory device by using the checked status check command.

19 Claims, 11 Drawing Sheets

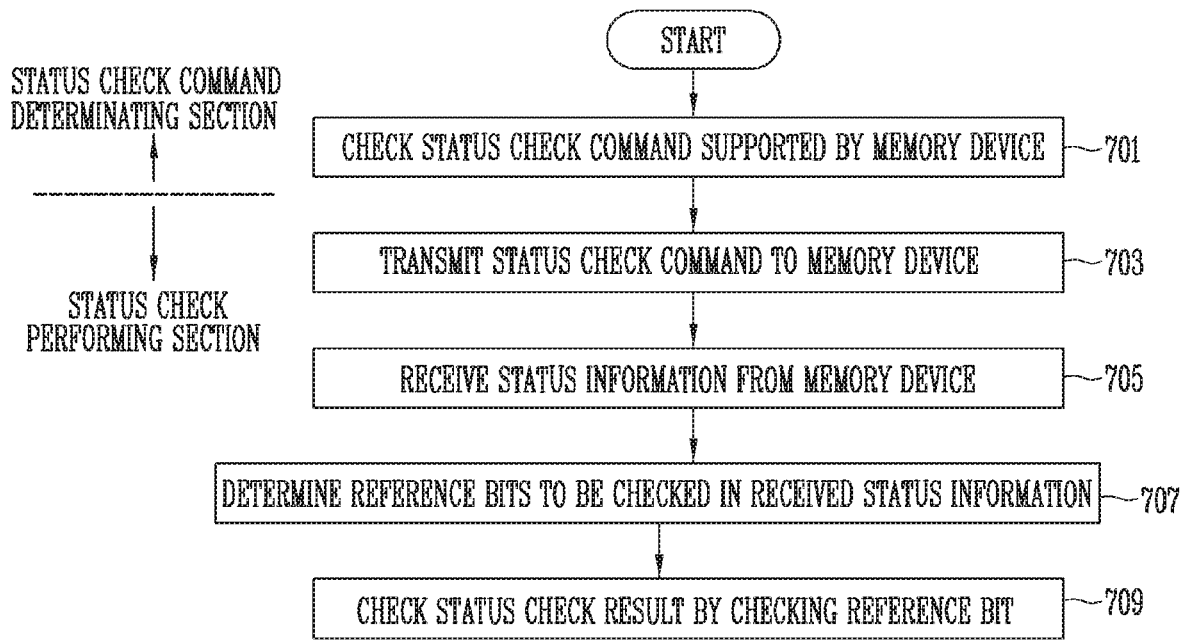

| STATUS CHECK COMMAND | DQ0 | DQ1 | DQ2 | DQ3 | DQ4 | DQ5 | DQ6 | DQ7 |
|---|---|---|---|---|---|---|---|---|
| FIRST STATUS CHECK COMMAND(70h) | PASS/FAIL | PASS/FAIL | R | R | Erase/Program Suspend state | ARDY | RDY | WP# |
| SECOND STATUS CHECK COMMAND(78h) | PASS/FAIL | PASS/FAIL | R | R | Erase/Program Suspend state | ARDY | RDY | WP# |
| ... | ... | ... | ... | ... | ... | ... | ... | ... |
| NTH STATUS CHECK COMMAND(7Ah) | PASS/FAIL | PASS/FAIL | PASS/FAIL | PASS/FAIL | PASS/FAIL | ARDY | RDY | WP# |

| STATUS CHECK COMMAND | OPERATION | REFERENCE BIT |
|---|---|---|
| FIRST STATUS CHECK COMMAND(70h) | PROGRAM OPERATION | DQ0, DQ1, DQ5, DQ6 |
| | READ OPERATION | DQ6 |
| | ⋮ | ⋮ |
| | SUSPEND OPERATION | DQ4 |
| SECOND STATUS CHECK COMMAND(78h) | PROGRAM OPERATION | DQ0, DQ1, DQ5, DQ6 |
| | READ OPERATION | DQ6 |
| | ⋮ | ⋮ |
| | SUSPEND OPERATION | DQ4 |
| ⋮ | ⋮ | ⋮ |
| NTH STATUS CHECK COMMAND(7Ah) | PROGRAM OPERATION | DQ0, DQ1, DQ2, DQ3, DQ4, DQ5, DQ6 |
| | READ OPERATION | DQ6 |
| | ⋮ | ⋮ |
| | SUSPEND OPERATION | – |

FIG. 11

| STATUS CHECK COMMAND | DQ0 | DQ1 |
|---|---|---|
| FIRST STATUS CHECK COMMAND(70h) | PASS/FAIL (OPERATION MOST RECENTLY PERFORMED ON PLANE 0, 1, 2 OR 3) | PASS/FAIL (OPERATION PREVIOUSLY PERFORMED ON PLANE 0, 1, 2 OR 3) |
| SECOND STATUS CHECK COMMAND(78h) | PASS/FAIL (OPERATION MOST RECENTLY PERFORMED ON SELECTED PLANE) | PASS/FAIL (OPERATION PREVIOUSLY PERFORMED ON SELECTED PLANE) |

MEMORY CONTROLLER, MEMORY SYSTEM HAVING THE MEMORY CONTROLLER, AND OPERATING METHOD OF THE MEMORY CONTROLLER

CROSS-REFERENCE TO RELATED APPLICATION

The present application claims priority to Korean patent application number 10-2018-0012916, filed on Feb. 1, 2018, which is incorporated herein by reference in its entirety.

BACKGROUND

1. Field of Invention

Various embodiments of the present invention generally relate to a memory controller, a memory system including the memory controller, and an operating method of the memory controller. Particularly, the embodiments relate to a memory controller capable of performing a status check according to a type of a memory device, a memory system including the memory controller, and an operating method of the memory controller.

2. Description of Related Art

A memory system may include a memory device and a memory controller.

The memory device may store data or output the stored data under the control of the memory controller. For example, the memory device may be configured as a volatile memory device in which stored data is lost when power supply is interrupted, or be configured as a nonvolatile memory device in which stored data is retained even when power supply is interrupted.

The memory controller may control data communication between a host and the memory device.

The host may communicate with the memory system by using an interface protocol such as Peripheral Component Interconnect-Express (PCI-e or PCIe), Advanced Technology Attachment (ATA), Serial ATA (SATA), Parallel ATA (DATA), or Serial Attached SCSI (SAS). Interface protocols between the host and the memory system are not limited to the above-described examples. For example, the host may communicate with the memory system by using various interfaces such as a Universal Serial Bus (USB), a Multi-Media Card (MMC), an Enhanced Small Disk Interface (ESDI), and Integrated Drive Electronics (IDE).

SUMMARY

Embodiments provide a memory controller capable of performing a status check according to a type of a memory device, a memory system having the memory controller, and operating method of the memory controller.

According to an aspect of the present disclosure, there is provided a memory controller including a status check command determining section configured to check a status check command supported by a memory device among a plurality of status check commands, and a status check performing section configured to perform a status check operation on the memory device by using the checked status check command.

According to an aspect of the present disclosure, there is provided a memory system including a memory device configured to output status information in response to a status check command, and a memory controller configured to check a status check command supported by the memory device among a plurality of status check commands, and perform a status check on the memory device by using the checked status check command.

According to an aspect of the present disclosure, there is provided a method for operating a memory controller, the method including receiving type information of a memory device from a host, checking a status check command supported by the memory device, based on the received type information of the memory device and a first table in which one or more pieces of type information of a memory device that supports each of the plurality of status check commands are mapped to the corresponding status check command, and performing a status check on the memory device by using the checked status check command.

According to an aspect of the present disclosure, there is provided a memory system including a memory device, and a controller configured to generate a status check command applicable to the memory device among a plurality of status check commands based on type information provided from a host and a first table, provide the generated status check command to the memory device, and receive a status check response from the memory device, and identify a status of the memory device by referring to one or more between second and third tables, wherein the first table includes information of the status check commands applicable to a plurality of memory device types, wherein the second table includes information of definitions about one or more status check bits included in each of a plurality of status check responses respectively corresponding to the status check commands, and wherein the third table includes information of one or more reference bits selected from the status check bits for each of a plurality of operations corresponding to each of the status check commands.

BRIEF DESCRIPTION OF THE DRAWINGS

Various embodiments will be described in more detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a flowchart describing a method for performing a status check according to an embodiment of the present disclosure.

FIG. 8 is a diagram illustrating a first table according to an embodiment of the present disclosure.

FIG. 9 is a diagram illustrating a second table according to an embodiment of the present disclosure.

FIG. 10 is a diagram illustrating a third table according to an embodiment of the present disclosure.

FIG. 11 is a diagram illustrating in detail status information shown in FIG. 9.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terminology used herein is for the purpose of describing particular embodiments only and is not intended to be limiting of the present invention.

As used herein, singular forms may include the plural forms as well and vice versa, unless the context clearly indicates otherwise.

It is noted that reference to "an embodiment" does not necessarily mean only one embodiment, and different references to "an embodiment" are not necessarily to the same embodiment(s).

Figure 1:
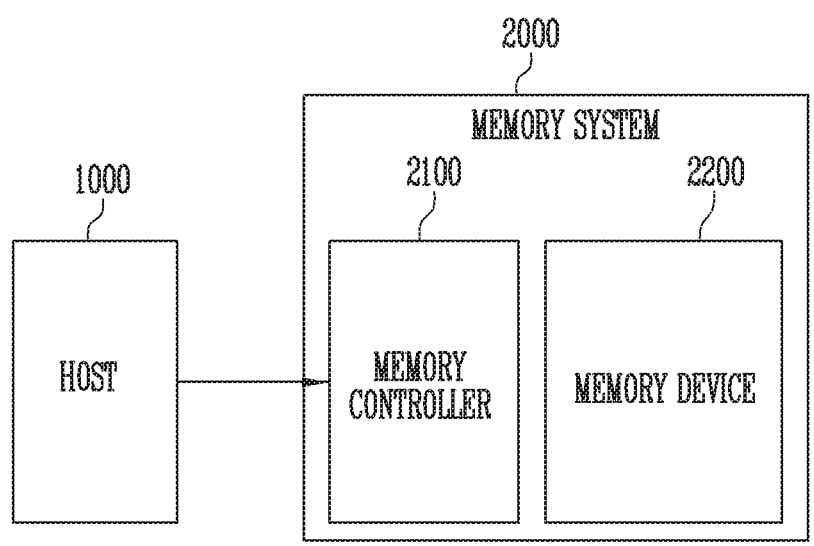
FIG. 1 is a diagram illustrating a memory system according to an embodiment of the present disclosure.

FIG. 1 is a diagram illustrating a memory system 2000 according to an embodiment of the present disclosure.

Referring to FIG. 1, the memory system 2000 may include a memory device 2200 for storing data and a memory controller 2100 for controlling the memory device 2200 under the control of a host 1000.

The host 1000 may communicate with the memory system 2000 by using an interface protocol such as Peripheral Component Interconnect-Express (PCI-e of PCIe), Advanced Technology Attachment (ATA), Serial ATA (SATA), Parallel ATA (PATA), or Serial Attached SCSI (SAS). Interface protocols between the host 1000 and the memory system 2000 are not limited to the above-described examples, and may include various other interface protocols such as a Universal Serial Bus (USB), a Multi-Media Card (MMC), an Enhanced Small Disk Interface (ESDI), and Integrated Drive Electronics (IDE).

Various types of memory devices 2200 may be mounted in the memory system 2000. For example, a memory device 2200 of type A may be mounted in the memory system 2000, or a memory device 2200 of type B may be mounted in the memory system 2000. A status check command supported by the memory device 2200 of type A may be different from that supported by the memory device 2200 of type B. That is, memory devices 2200 of different types may operate in response to different status check commands supported thereby.

When a memory device 2200 of a specific type is mounted in the memory system 2000, the host 1000 may transmit type information of the corresponding memory device 2200 to the memory controller 2100. The type information of the memory device 2200 may be, for example, a product number, serial number or package information of the memory device 2200. However, the type information of the memory device 2200 is not limited thereto, and various information capable of distinguishing memory devices 2200 from each other may be used as the type information.

The memory controller 2100 may control overall operations of the memory system 2000, and control data exchange between the host 1000 and the memory device 2200. For example, the memory controller 2100 may translate received information such that a command, an address, and data can be communicated between the host 1000 and the memory device 2200, and store or output the translated information. For example, in a program operation, the memory controller 2100 may transmit a command, an address, data, and the like to the memory device 2200.

The memory controller 2100 may perform a status check on the memory device 2200. For example, the memory controller 2100 may generate a status check command, transmit the status check command to the memory device 2200, and receive status information from the memory device 2200 in response to the status check command. For example, the memory controller 2100 may check a status of the memory device 2200 based on the status information received from the memory device 2200. For example, the memory controller 2100 may check information on whether the memory device 2200 is currently under operation or in an idle status. The status information output from the memory device 2200 may include various information. For example, the status information may include information on whether the status check command output from the memory controller 2100 has been normally received, information on whether the memory device 2200 is currently in the idle status, information on whether the memory device 2200 is currently in a busy status (i.e., under operation), and the like. Also, when a status check operation is performed after a program operation of the memory device 2200, the memory controller 2100 may check whether the program operation of the memory device 2200 has been normally performed, by checking the status information received from the memory device 2200. For example, when a status check operation is performed after a read operation of the memory device 2200, the memory controller 2100 may check whether the read operation of the memory device 2200 has been normally performed, by checking the status information received from the memory device 2200.

The memory controller 2100 may check a status check command supported by the memory device 2200, and perform a status check on the memory device 2200, using the checked status check command. For example, the memory controller 2100 may receive type information of the memory device 2200 from the host 1000, and check the status check command supported by the memory device 2200, based on the received type information of the memory device 2200. The status check command supported by the memory device 2200 may be checked based on a first table that stores a plurality of status check commands and one or more pieces of type information of memory devices 2200 supporting the respective status check commands. For example, the memory controller 2100 may check a status check command corresponding to the type information of the memory device 2200, which is received from the host 1000, with reference to the first table. In some embodiments, the first table may be received from the host 1000 or stored in the memory controller 2100 during manufacture of the memory controller 2100.

The memory controller 2100 may perform a status check on the memory device 2200, using a checked status check command. For example, the memory controller 2100 may generate a checked status check command and transmit the generated status check command to the memory device 2200. The memory controller 2100 may receive status information from the memory device 2200 in response to the status check command. The memory controller 2100 may check a status check result by checking the status information received from the memory device 2200. The status check result may be checked based on a second table that records definitions of a plurality of bits representing status information corresponding to each of the plurality of status check commands. For example, the memory controller 2100 may check the status check result by checking definitions of the bits representing the status information received from the memory device 2200, with reference to the second table. In some embodiments, the second table may be received from the host 1000 or stored in the memory controller 2100 during manufacture of the memory controller 2100.

When the memory controller 2100 performs a status check, the memory controller 2100 may determine one or more bits as reference bits to be checked among the plurality of bits representing status information received from the memory device 2200, and check a status check result of the memory device 2200 based on the reference bits. The reference bits may be determined based on a third table that stores information of the reference bits among the plurality of bits representing status information in response to each of the plurality of status check commands. For example, the memory controller 2100 may check the status check result of the memory device 2200, based on the reference bits in the status information received from the memory device 2200, with reference to the third table. The status check result may be checked based on the second table. For example, the memory controller 2100 may check the status check result of the memory device 2200 by checking the definitions of the reference bits with reference to the second table. In some embodiments, the third table may be received from the host 1000 or stored in the memory controller 2100 during manufacture of the memory controller 2100.

The memory controller 2100 may determine status information to be checked by further considering a kind of operation on which the status check is to be performed. For example, the third table may store reference bits corresponding to each operation. That is, the third table may store the plurality of status check commands, store a plurality of operations for each of the status check commands, and store one or more reference bits to be checked for each of the operations. The memory controller 2100 may determine, as status information to be checked, the reference bits mapped to the operation on which the status check is to be performed with reference to the third table.

Meanwhile, a plurality of status check commands may be supported by the memory device 2200. The memory controller 2100 may perform a status check on the memory device 2200 by selecting any one status check command among the plurality of status check commands. In some embodiments, the memory controller 2100 may perform a status check using a first status check command among the plurality of status check commands supported by the memory device 2200, and further perform another status check using a second status check command, based on the result of the status check using the first status check command.

The memory device 2200 may perform an operation under the control of the memory controller 2100. For example, the memory device 2200 may perform a program operation, a read operation, an erase operation, a suspend operation, a copy-back operation, and the like.

The memory device 2200 may store status information in a status register while performing an operation under the control of the memory controller 2100. When a status check command is received from the memory controller 2100, the memory device 2200 may transmit the status information stored in the status register to the memory controller 2100.

The memory device 2200 may be configured as a volatile memory device in which stored data is lost when power supply is interrupted, or be configured as a nonvolatile memory device in which stored data is retained even when power supply is interrupted.

Figure 2:
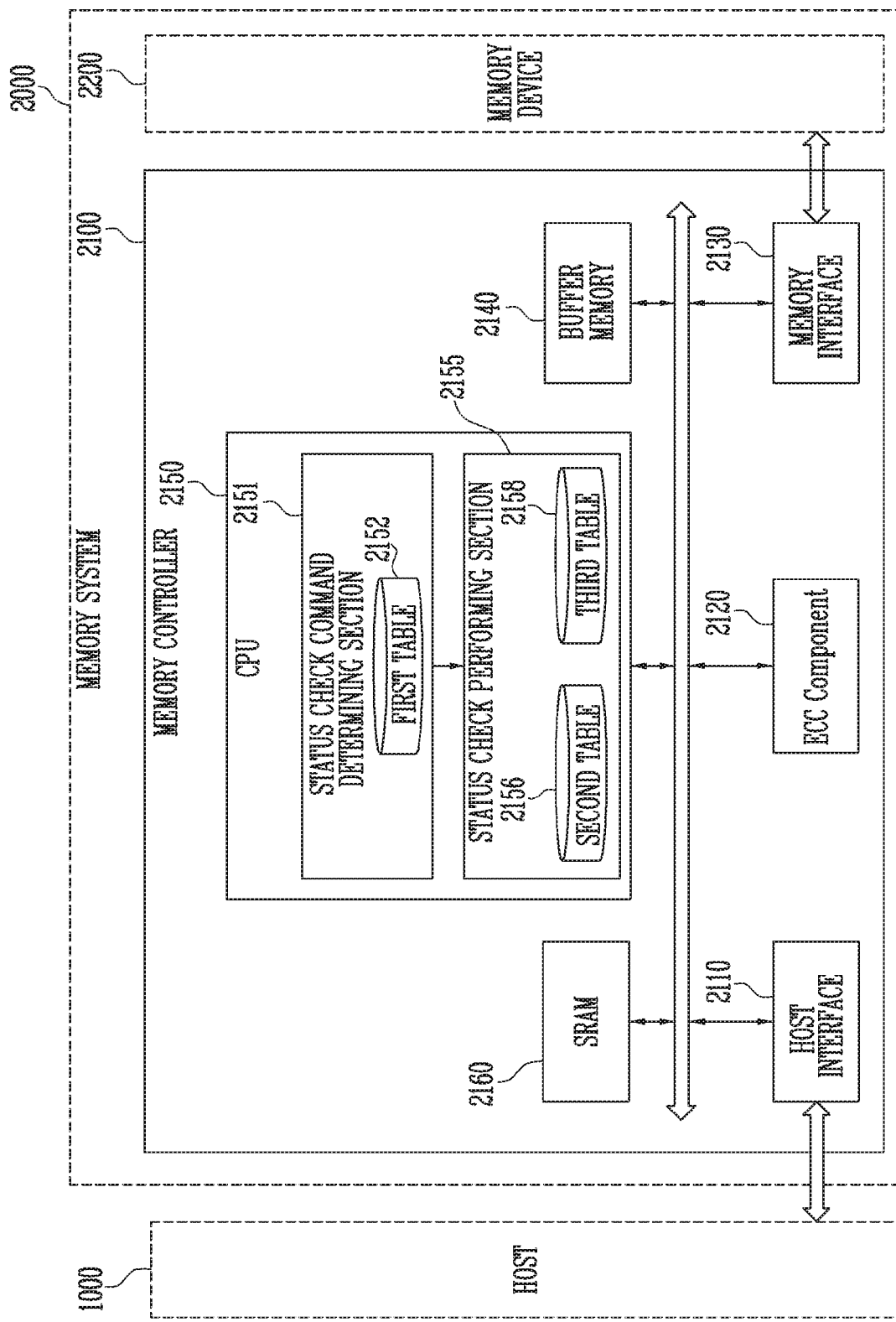
FIG. 2 is a diagram illustrating a memory controller shown in FIG. 1.

FIG. 2 is a diagram illustrating a memory controller, for exam p e, the memory controller 2100 shown in FIG. 1.

Referring to FIG. 2, the memory controller 2100 may include a host interface 2110, an error correction code (ECC) component 2120, a memory interface 2130, a buffer memory 2140, a central processing unit (CPU) 2150, and a static random access memory (SRAM) 2160. The host interface 2110, the ECC component 2120, the memory interface 2130, the buffer memory 2140, and the SRAM 2160 may be controlled by the CPU 2150.

The host interface 2110 may perform data exchange with the host 1000, using a communication protocol.

The ECC component 2120 may detect an error and correct the detected error in a program or read operation.

The memory interface 2130 may perform communication with the memory device 2200, using a communication protocol.

The buffer memory 2140 may temporarily store data while the memory controller 2100 is controlling the memory device 2200. For example, data received from the host may be temporarily stored in the buffer memory 2140 until a program operation is completed. Also, in a read operation, data read from the memory device 2200 may be temporarily stored in the buffer memory 2140.

The CPU 2150 may perform various calculations or generate a command and an address to control the memory device 2200. For example, the CPU 2150 may generate various commands required to perform a program operation, a read operation, an erase operation, a suspend operation, and a copy-back operation.

The CPU 2150 may perform a status check on the memory device 2200, using a status check command corresponding to a type of the memory device. Type information of the memory device 2200 may be received from the host 1100.

The CPU 2150 may include a status check command determining section 2151 and a status check performing section 2155.

The status check command determining section 2151 may check a status check command supported by the memory device 2200 among a plurality of status check commands defined in a first table 2152. For example, the status check command determining section 2151 may check a status check command corresponding to the type information of the memory device 2200, which is received from the host 1000, with reference to the first table 2152. The status check command determining section 2151 may provide information on the checked status check command to the status check performing section 2155. The information on the status check command may indicate the checked status check command.

The status check performing section 2155 may receive information on the status check command supported by the memory device 2200 from the status check command determining section 2151, and perform a status check on the memory device 2200, using the checked status check command indicated by the information on the status check command. For example, the status check performing section 2155 may generate the status check command checked by the status check command determining section 2151, and transmit the generated status check command to the memory device 2200.

The status check performing section 2155 may check a status check result by checking status information received from the memory device 2200, corresponding to the status check command provided to the memory device 2200. The status check result may be checked based on at least one of the second table 2156 and the third table 2158. For example, the status check performing section 2155 check the definition of each bit of the status information received from the memory device 2200, with reference to the second table 2156. For example, the status check performing section 2155 may check the status check result by checking the reference bits in the status information received from the memory device 2200, with reference to the third table 2158.

When a plurality of status check commands are supported by the memory device 2200, the status check performing section 2155 may perform a status check on the memory device 2200 by selecting any one status check command among the plurality of corresponding status check commands. In some embodiments, the status check performing section 2155 may perform a status check using a first status check command among the plurality of status check commands supported by the memory device 2200, and further perform a status check using a second status check command, based on the result of the status check using the first status check command.

The SRAM 2160 may be used as a storage unit for storing various information required to perform an operation of the memory controller 2100.

Figure 3:
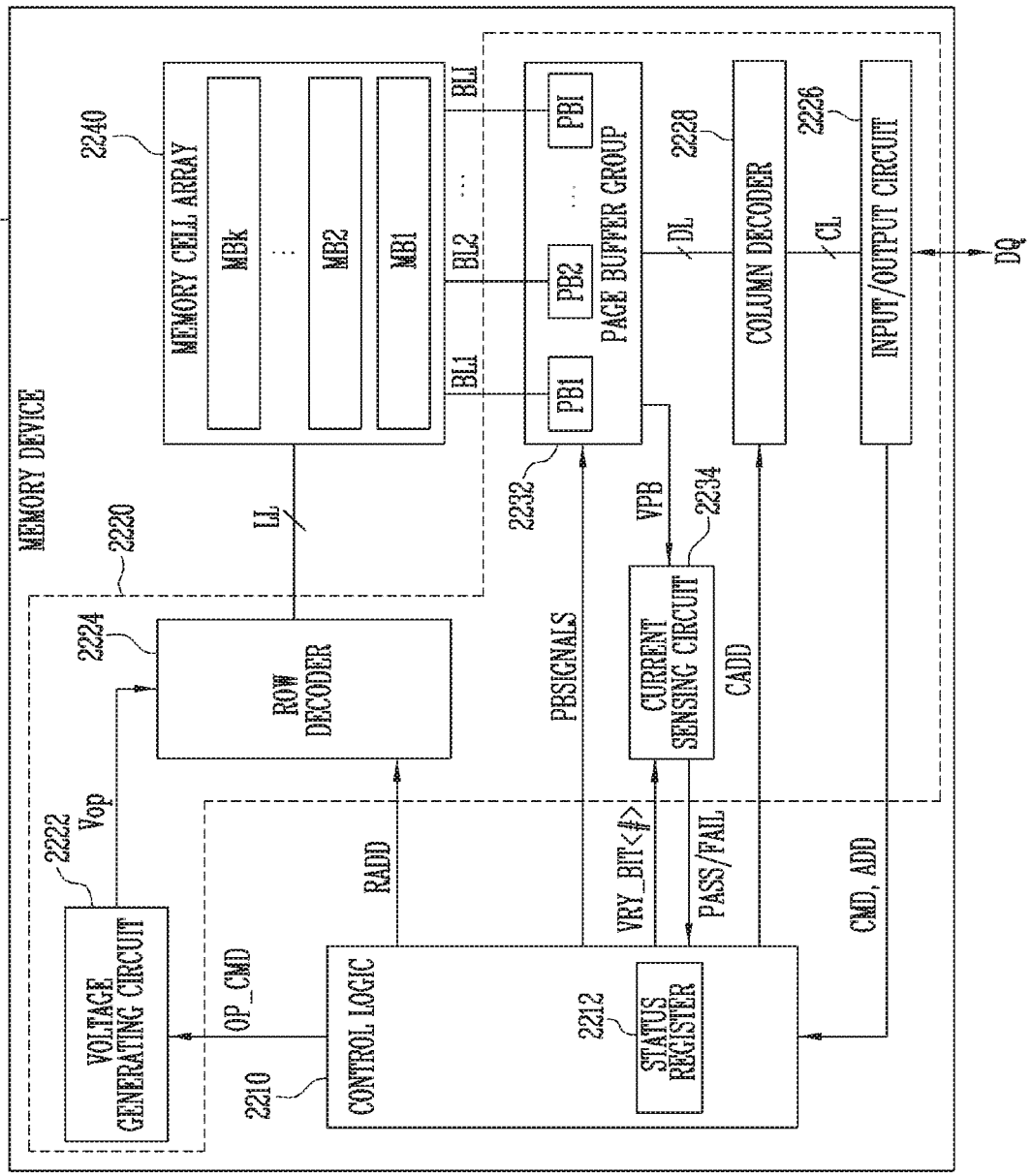
FIG. 3 is a diagram illustrating a memory device shown in FIGS. 1 and 2.

FIG. 3 is a diagram illustrating a memory device, for example, the memory device 2200 shown in FIGS. 1 and 2.

The memory device 2200 may include a control logic 2210, peripheral circuits 2220, and a memory cell array 2240. The peripheral circuits 2220 may include a voltage generating circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 shown in FIG. 2. The control logic 2210 may control the peripheral circuits 2220 in response to a command CMD and an address ADD, which are received from the memory controller 2100 through the input/output circuit 2226. For example, the control logic 2210 may output an operation signal OP_CMD, a row address RADD, page buffer control signals PBSIGNALS, and a permission bit VRY_BIT<#> in response to the command CMD and the address ADD received from the memory controller 2100 through the input/output circuit 2226. The control logic 2210 may determine whether a verify operation has passed or failed in response to a pass or fail signal PASS or FAIL received from the current sensing circuit 2234.

The command CMD received from the memory controller 2100 may include an operation command and a status check command. The operation command may include a program operation command, an erase operation command, a read operation command, a suspend operation command, and a copy-back operation command.

The control logic 2210 may record a status of the memory device 2200 in a status register 2212 while performing an operation in response to a command received from the memory controller 2100. For example, when the command received from the memory controller 2100 is a program operation command, the control logic 2210 may record, in the status register 2212, whether the corresponding program operation command has succeeded or failed.

When a status check command is received from the memory controller 2100, the control logic 2210 may transmit status check bits stored in the status register 2212 to the memory controller 2100.

The peripheral circuits 2220 may perform a program operation for storing data in the memory cell array 2240, a read operation for outputting data stored in the memory cell array 2240, or an erase operation for erasing data stored in the memory cell array 2240, under the control of the control logic 2210. Also, peripheral circuits 2220 may perform a suspend operation for suspending a currently performed operation or a copy-back operation for copying data to another memory block.

The voltage generating circuit 2222 may generate various operating voltages Vop used for program, read, and erase operations in response to an operation signal OP_CMD received from the control logic 2210. For example, the voltage generating circuit 2222 may generate a program voltage, a verify voltage, a pass voltage, a compensation program voltage, a read voltage, an erase voltage, a turn-on voltage, and the like.

The row decoder 2224 may transfer the operating voltages Vop to local lines LL coupled to a selected memory block among memory blocks of the memory cell array 2240 in response to a row address RADD received from the control logic 2210. The local lines LL may include local word lines, local drain select lines, and local source select lines. In addition, the local lines LL may include various lines such as a source line, which are coupled to the memory block.

The input/output circuit 2226 may transfer the command CMD and the address ADD, which are received from the memory controller 2100, to the control logic 2210 through input/output lines DQ, or exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBI through data lines DL, or exchange data with the input/output circuit 2226 through column lines CL.

The page buffer group 2232 may be coupled to bit lines BL1 to BLI commonly coupled to the memory blocks included in the memory cell array 2240. The page buffer group 2232 may include a plurality of page buffers PB1 to PBI coupled to the bit lines BL1 to BLI. For example, one page buffer may be coupled to each of the bit lines. The page buffers PB1 to PBI may operate in response to the page buffer control signals PBSIGNALS received from the control logic 2210. For example, in a program operation, the page buffers PB1 to PBI may temporarily store program data received from the memory controller 2100, and adjust a voltage applied to the bit lines BL1 to BLI according to the program data. Also, in a read operation, the page buffers PB1 to PBI may temporarily store data received through the bit lines BL1 to BLI, or sense a voltage or current of the bit lines BL1 to BLI. In a read or verify operation, the current sensing circuit 2234 may generate a reference current in response to the permission bit VRY_BIT<#> received from the control logic 2210, and output a pass or fail signal PASS or FAIL by comparing a sensing voltage VPB received from the page buffer group 2232 with a reference voltage generated by the reference current.

The memory cell array 2240 may include a plurality of memory blocks MB1 to MBk for storing data. User data and various information required to perform an operation of the memory device 2200 may be stored in the memory blocks MB1 to MBk. The memory blocks MB1 to MBk may be implemented in a two-dimensional structure or a three-dimensional structure. Each of the memory blocks MB1 to MBk may be configured identical to one another.

Figure 4:
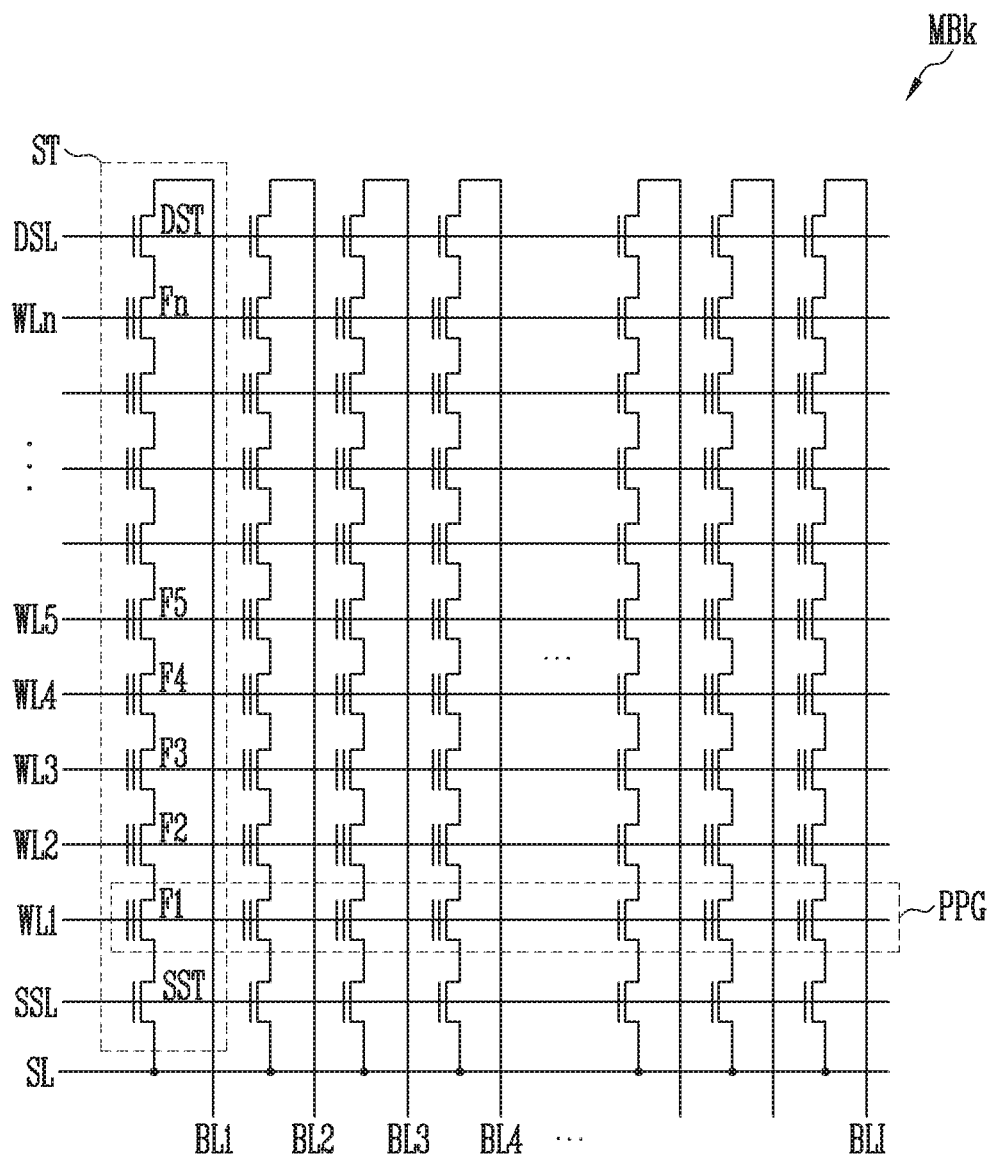
FIG. 4 is a diagram illustrating an example of a memory block having a two-dimensional structure.

FIG. 4 is a diagram illustrating an example of a memory block having a two-dimensional structure.

A memory cell array may include a plurality of memory blocks, for example, the memory blocks MB1 to MBk shown in FIG. 3. The memory block MBk shown in FIG. 4 may correspond to any memory block among the plurality of memory blocks MB1 to MBk shown in FIG. 3. For convenience of description, any one memory block MBk among the plurality of memory blocks is illustrated in FIG. 4.

The memory block MBk may include a plurality of cell strings ST coupled between bit lines BL1 to BLI and a source line SL. The cell strings ST may be respectively coupled to the bit lines BL1 to BLI, and be commonly coupled to the source line SL. The cell strings ST have similar structures. Therefore, hereinafter, a cell string ST coupled to a first bit line BL1 will be described as an example.

The cell string ST may include a source select transistor SST, first to nth memory cells F1 to Fn (n is a positive integer), and a drain select transistor DST, which are coupled in series between the source line SL and the first bit line BL1. The number of source select transistors SST and drain select transistor DST is not limited to that shown in FIG. 4.

The source select transistor SST may be coupled between the source line SL and the first memory cell F1. The first to nth memory cells F1 to Fn may be coupled in series between the source select transistor SST and the drain select transistor DST. The drain select transistor DST may be coupled between the nth memory cell Fn and the first bit line BL1. Although not shown in the drawing, dummy cells may be further coupled between the memory cells F1 to Fn or between the source select transistor SST and the drain select transistor DST.

Gates of the source select transistors SST included in the cell strings ST may be coupled to a source select line SSL. Gates of the first to nth memory cells F1 to Fn may be coupled to first to nth word lines WL1 to WLn. Gates of the drain select transistors DST included in the cell strings ST may be coupled to a drain select line DSL. A group of memory cells coupled to each of the word lines WL1 to WLn may be referred to as a physical page PPG. For example, a group of the first memory cells F1 coupled to the first word line WL1 among the memory cells F1 to Fn included in different cell strings ST may become one physical page PPG. When a multi-level cell (MLC) method is used, a plurality of logical pages may be included in one physical page PPG.

Figure 5:
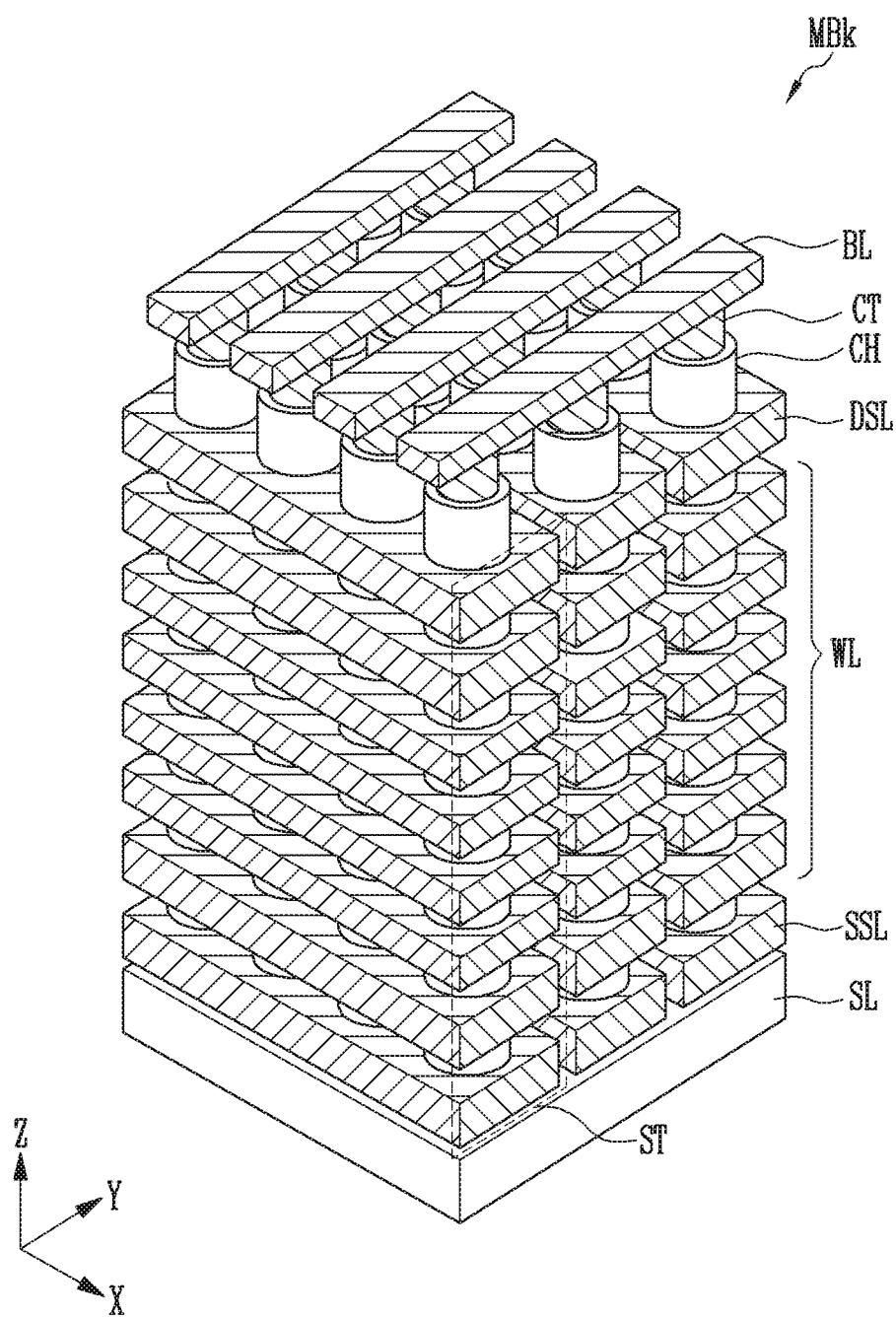
FIG. 5 is a diagram illustrating an example of a memory block having a three-dimensional structure.

FIG. 5 is a diagram illustrating an example of a memory block having a three-dimensional structure.

A memory cell array may include a plurality of memory blocks, for example, the memory blocks MB1 to MBk shown in FIG. 3. The memory block MBk shown in FIG. 5 may correspond to any memory block among the plurality of memory blocks MB1 to MBk shown in FIG. 3. For convenience of description, any one memory block MBk among the plurality of memory blocks is illustrated in FIG. 5.

Referring to FIG. 5, the memory block MBk having the three-dimensional structure may be formed in an I-shape on a substrate in a direction vertical to the substrate (i.e., Z-direction). The memory block MBk may include a plurality of cell strings ST arranged between bit lines BL and a source line SL. In some embodiments, a well may be formed instead of the source line SL. This structure may be referred to as a Bit Cost Scalable (BiCS) structure. For example, when the source line SL is formed in parallel to the substrate above the substrate, the cell strings ST having the BiCS structure may be formed in the direction vertical to the substrate (i.e., Z-direction) on the top of the source line SL.

Specifically, the cell strings ST may be arranged in a first direction (i.e., X-direction) and a second direction (i.e., Y-direction). The cell strings ST may include source select lines SSL, word lines WL, and drain select lines DSL, which are stacked while being spaced apart from each other. The number of source select lines SSL, word lines WL, and drain select lines DSL is not limited to that shown in the drawing, and may vary depending on an embodiment. The cell strings ST may include vertical channel layers CH and the bit lines BL. The vertical channel layers CH may vertically penetrate the source select lines SSL, the word lines WL, and the drain select lines DSL. The bit lines BL may be in contact with the tops of the vertical channel layers CH protruding to the tops of the drain select lines DSL, and extend in the second direction (i.e., Y-direction). Memory cells may be formed between the word lines WL and the vertical channel layers CH. Contact plugs CT may be further formed between the bit lines BL and the vertical channel layers CH.

Figure 6:
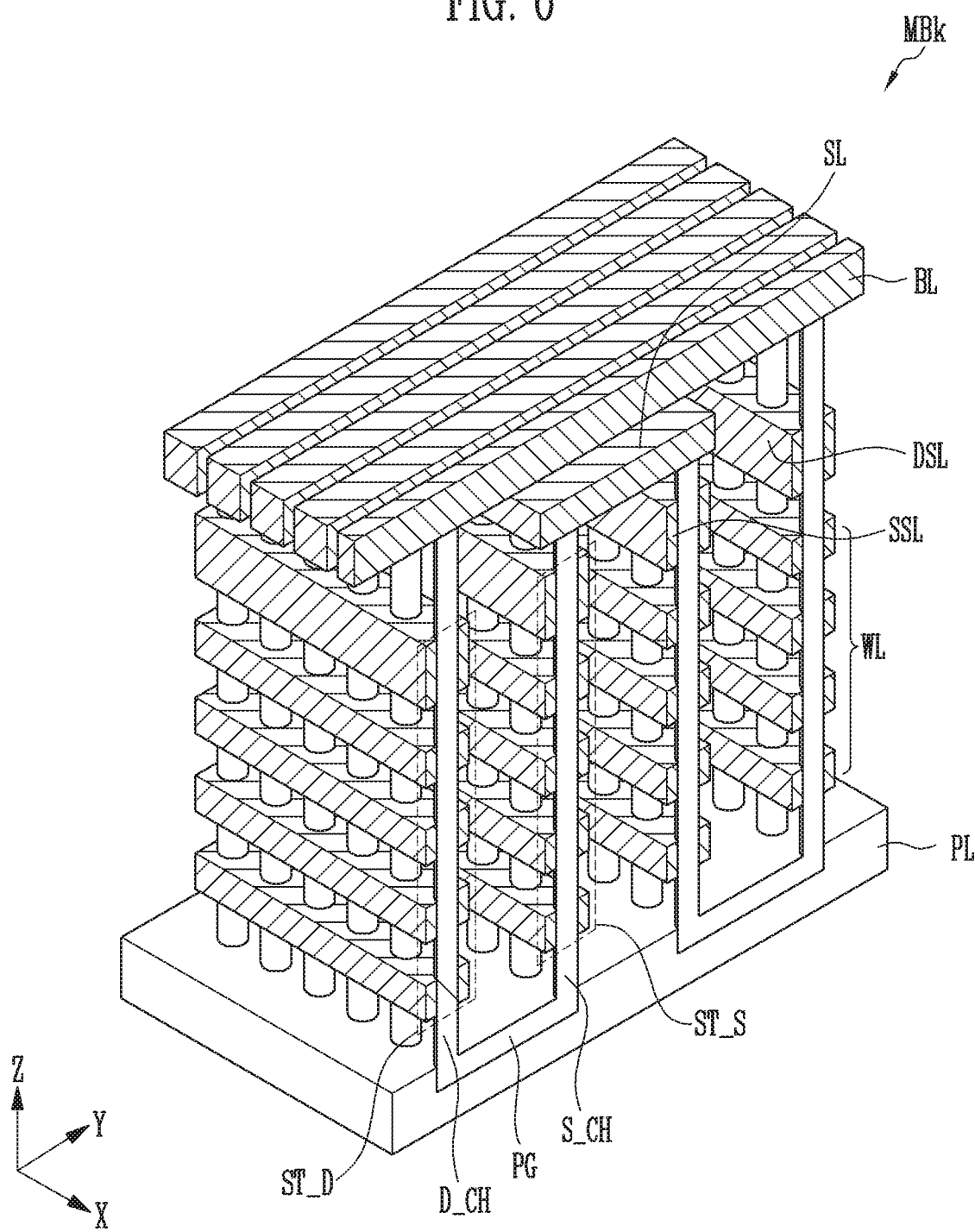
FIG. 6 is a diagram illustrating another example of the memory block having the three-dimensional structure.

FIG. 6 is a diagram illustrating another example of the memory block having the three-dimensional structure.

A memory cell array may include a plurality of memory blocks, for example, the memory blocks MB1 to MBk shown in FIG. 3. The memory block MBk shown in FIG. 6 may correspond to any memory block among the plurality of memory blocks MB1 to MBk shown in FIG. 3. For convenience of description, any one memory block MBk among the plurality of memory blocks is illustrated in FIG. 6.

Referring to FIG. 6, the memory block MBk having the three-dimensional structure may be formed on a substrate in a U-shape in a direction vertical to the substrate (i.e., Z-direction). The memory block MBk may include source strings ST_S and drain strings which are coupled between bit lines BL and source lines SL and form pairs. The source string ST_S and the drain string ST_D may be coupled to each other through a pipe gate PG to form a U-shaped structure. The pipe gate PG may be formed in a pipe line PL.

Specifically, the source strings ST_S may be formed vertically to the substrate between the source line SL and the pipe line PL, and the drain strings ST_D may be formed vertically to the substrate between the bit lines BL and the pipe line PL. This structure may be referred to as a Pipe-shaped Bit Cost Scalable (P-BiCS) structure.

Specifically, the drain strings ST_D and the source strings ST_S may be arranged in a first direction (i.e., X-direction) and a second direction (i.e., Y-direction). The drain strings ST_D and the source strings ST_S may be alternately arranged along the second direction (i.e., Y-direction). The drain strings ST_D may include word lines WL and a drain select line DSL, which are stacked while being spaced apart from each other. The drain strings ST_D may include may include drain vertical channel layers D_CH that vertically penetrate the word lines WL and the drain select line DSL. The source strings ST_S may include word lines WL and a source select line SSL, which are stacked while being spaced apart from each other. The source strings ST_S may include source vertical channel layers S_CH that vertically penetrate the word lines WL and the source select line SSL. The drain vertical channel layers D_CH and the source vertical channel layers S_CH may be coupled to each other by the pipe gate PG in the pipe line PL. The bit lines BL may be in contact with the tops of the drain vertical channel layers D_CH protruding to the top of the drain select line DSL, and extend in the second direction (Y direction).

FIG. 7 is a flowchart illustrating a method for performing a status check according to an embodiment of the present disclosure.

The embodiment described with reference to FIG. 7 may be applied to the memory system described with reference to FIGS. 1 to 6. In some embodiments, at least one of steps shown in FIG. 7 may be omitted. In some embodiments, the order of the steps shown in FIG. 7 may be changed.

In step 701, the status check command determining section 2151 may check a status check command supported by a memory device 2200. For example, the status check command determining section 2151 may check the status check command supported by the memory device 2200, based on type information of the memory device 2200, which is received from the host 1000, and the first table 2152.

In steps 703 to 709, the status check performing section 2155 may perform a status check on the memory device 2200, using the status check command checked by the status check command determining section 2151.

In the step 703, the status check performing section 2155 may generate a status check command checked by the status check command determining section 2151, and transmit the generated status check command to the memory device 2200. When a plurality of status check commands are supported by the memory device 2200, the status check performing section 2155 may select any one status check command among the plurality of corresponding status check commands, and transmit the selected status check command to the memory device 2200.

In the step 705, the status check performing section 2155 may receive status information from the memory device 2200, corresponding to the status check command provided to the memory device 2200.

In the step 707, the status check performing section 2155 may determine the reference bits to be checked in the received status information. For example, the status check performing section 2155 may determine the reference bits to be checked in the status information corresponding to the status check command transmitted to the memory device, using the third table 2158. In some embodiments, the status check performing section 2155 may determine the reference bits to be checked by further considering a kind of operation on which the status check is to be performed. For example, before the status check command is transmitted, the status check performing section 2155 may check a kind of operation command transmitted to the memory device 2200 with reference to an operation command queue. Subsequently, the status check performing section 2155 may determine the reference bits to be checked for an operation corresponding to the checked operation command, with reference to the third table 2158.

In the step 709, the status check performing section 2155 may check a status check result by checking the reference bits. For example, the status check performing section may check the status check result of the memory device by checking the definition of the reference bits in the status information received from the memory device, with reference to the second table 2156.

Meanwhile, as described above, when a plurality of status check commands are supported by the memory device 2200, the status check performing section 2155 may perform a status check on the memory device 2200, using a first status check command among the plurality of corresponding status check commands. The status check performing section 2155 may perform another status check on the memory device 2200, using a second status check command, based on a result obtained by performing the status check using the first status check command. This will be described in later with reference to FIG. 11.

FIG. 8 is a diagram illustrating a first table, for example, the first table 2152 shown in FIG. 2, according to an embodiment of the present disclosure.

In the first table 2152, one or more pieces of type information of memory devices are mapped to each of a plurality of status check commands supported by the memory devices 2200.

Referring to FIG. 8, it is shown as an example that a memory device corresponding to type A supports a first status check command 70h, a second status check command 78h, and an Nth status check command 7Ah, while a memory device corresponding to type B only supports the second status check command 78h.

When the type information of a memory device, which is received from the host 1000, represents type A, the status check command determining section 2151 may check the first status check command 70h, the second status check command 78h, and the Nth status check command 7Ah for the memory device of the type A, and perform a status check on the memory device of the type A, using at least one status check command among the checked status check commands.

FIG. 9 is a diagram illustrating a second table, for example, the second table 2156, according to an embodiment of the present disclosure.

Definitions of bits representing status information corresponding to each of a plurality of status check commands may be recorded in the second table 2156.

In the embodiment described with reference to FIG. 9, it is assumed, for convenience and illustrative purposes, that a memory device includes four planes.

A bit received through a first input/output line DQ0 in status information corresponding to the first status check command 70h or the Nth status check command 7Ah may represent pass or fail of an operation that has most recently been performed on at least one plane among the four planes. A bit received through a first input/output line DQ0 in status information corresponding to the second status check command 78h may represent pass or fail of an operation that has most recently been performed on a selected plane among the four planes.

A bit received through a second input/output line DQ1 in the status information corresponding to the first status check command 70h may represent pass or fail of a previous operation performed on at least one plane among the four planes. A bit received through a second input/output line DQ1 in the status information corresponding to the second status check command 78h may represent pass or fail of a previous operation performed on a selected plane among the four planes. A bit received through a second input/output line DQ1 in the status information corresponding to the Nth status check command 7Ah may represent pass or fail of an operation that has most recently been performed on plane 0 among the four planes.

Bits received through a third input/output line DQ2 and a fourth input/output line DQ3 in the status information corresponding to the first status check command 70h or the second status check command 78h may be bits reserved for later use. A bit received through a third input/output line DQ2 in the status information corresponding to the Nth status check command 7Ah may represent pass or fail of an operation that has most recently been performed on plane 1 among the four planes. A bit received through a fourth input/output line DQ3 in the status information corresponding to the Nth status check command 7Ah may represent pass or fail of an operation that has most recently been performed on plane 2 among the four planes.

A bit received through a fifth input/output line DQ4 in the status information corresponding to the first status check command 70h or the second status check command 78h may represent whether a program operation or an erase operation is in a suspend state. A bit received through a fifth input/output line DQ4 in the status information corresponding to the Nth status check command 7Ah may represent pass or fail of an operation that has most recently been performed on plane 3 among the four planes.

A bit received through a sixth input/output line DQ5 in the status information corresponding to the first status check command 70h, the second status check command 78h, or the Nth status check command 78A may represent whether an array operation is being performed on at least one plane among the four planes.

A bit received through a seventh input/output line DQ6 in the status information corresponding to the first status check command 70h, the second status check command 78h, or the Nth status check command 78A may represent whether the memory device has been ready to receive a new operation command.

A bit received through an eighth input/output line DQ7 in the status information corresponding to the first status check command 70h, the second status check command 78h, or the Nth status check command 78A may represent whether a One Time Programmable (OTP) area has been protected.

Meanwhile, status information corresponding to the status check commands may exhibit different status check results. For example, a bit received through the first input/output line DQ0, corresponding to the first status check command 70h, and a bit received through the first input/output line DQ0, corresponding to the second status check command 78h, may exhibit different status check results. For example, as described above, the bit received through the first input/output line DQ0, corresponding to the first status check command 70h, may represent whether a most recent operation performed on at least one plane among the planes of the memory device has succeeded or failed. On the other hand, the bit received through the first input/output line DQ0, corresponding to the second status check command 78h, may represent whether the most recent operation performed on a selected plane among the planes of the memory device has succeeded or failed. That is, although the same status check bit is received, the status check bit may exhibit different status check results depending on kinds of status check command.

Accordingly, the status check performing section can check a status check result by checking the definitions of the bits representing the status information received from the memory device.

FIG. 10 is an exemplary diagram illustrating a third table, for example, the third table 2158 shown in FIG. 2, according to an embodiment of the present disclosure.

In the third table 2158, a plurality of operations are mapped to each of a plurality of status check commands, and one or more reference bits to be checked are mapped to each of the operations.

For example, when it is assumed that the first status check command 70h is generated after a program operation, the third table 2158 defines, as the reference bits, a bit received through the first input/output line DQ0, a bit received through the second input/output line DQ1, a bit received through the sixth input/output line DQ5, and a bit received through the seventh input/output line DQ6. Therefore, the memory controller may check a status check result corresponding to the program operation by checking as the reference bits the bit received through the first input/output line DQ0, the bit received through the second input/output line DQ1, the bit received through the sixth input/output line DQ5, and the bit received through the seventh input/output line DQ6 in the status information received from the memory device, corresponding to the first status check command 70h.

For example, when it is assumed that the first status check command 70h is generated after a read operation, the third table 2158 defines, as the reference bit, a bit received through the seventh input/output line DQ6. Therefore, the memory controller may check a status check result corresponding to the read operation by checking as the reference bit the bit received through the seventh input/output line DQ6 in the status information received from the memory device, corresponding to the first status check command 70h.

For example, when it is assumed that the first status check command 70h is generated after a suspend operation, the third table 2158 defines, as the reference bit, a bit received through the fifth input/output line DQ4. Therefore, the memory controller may check a status check result corresponding to the suspend operation by checking as the reference bit the bit received through the fifth input/output line DQ4 in the status information received from the memory device, corresponding to the first status check command 70h.

Detailed descriptions of the second status check command 78h and the Nth status check command 7Ah will be omitted.

Meanwhile, as described above, a plurality of status check commands may be supported by one memory device. The memory controller may perform a status check on the memory device by selecting a first one among the plurality of status check commands supported by the memory device. The first status check command may be selected randomly or according to a preset order of priority. For example, it is assumed that the memory device supports the first status check command 70h and the second status check command 78*h*, and an order of priority of the first status check command 70*h* is set higher than that of the second status check command 78*h*. The memory controller may perform a status check on the memory device, using the first status check command 70*h*. The memory controller may determine whether a status check using the second status check command 78*h* is to be further performed, based on a result obtained by performing the status check using the first status check command 70*h*. This will be described with reference to FIG. 11.

FIG. 11 is a diagram illustrating in more detail the status information shown in FIG. 9.

For convenience of description, only a portion of the status information shown in FIG. 9 is illustrated in FIG. 11.

Referring to FIG. 11, a bit received through the first input/output line DQ0, corresponding to the first status check command 70*h*, may represent whether a most recent operation performed on at least one plane among plane 0, plane 1, plane 2, and plane 3 of the memory device has succeeded (i.e., passed) or failed. For example, when the bit received through the first input/output line DQ0, corresponding to the first status check command 70*h* is '0', the bit represents that the most recent operation performed on at least one plane among the planes of the memory device has succeeded. For example, when the bit received through the first input/output line DQ0, corresponding to the first status check command 70*h* is '1', the bit represents that the most recent operation performed on at least one plane among the planes of the memory device has failed.

A bit received through the second input/output line DQ1, corresponding to the first status check command 70*h*, may represent whether a previous operation performed on at least one plane among the plane 0, plane 1, plane 2, and plane 3 of the memory device has succeeded (i.e., passed) or failed. For example, when the bit received through the second input/output line DQ1, corresponding to the first status check command 70*h* is '0,' the bit represents that the previous operation performed on at least one plane among the planes of the memory device has succeeded. For example, when the bit received through the second input/output line DQ1, corresponding to the first status check command 70*h* is '1,' the bit represents that the previous operation performed on at least one plane among the planes of the memory device has failed.

A bit received through the first input/output line DQ0, corresponding to the second status check command 78*h*, may represent whether a most recent operation performed on a selected plane among plane 0, plane 1, plane 2, and plane 3 of the memory device has succeeded (i.e., passed) or failed. That is, the bit received through the first input/output line NO, corresponding to the second status check command 78*h*, may represent a status check result corresponding to one plane, unlike the bit received through the first input/output line DQ0, corresponding to the first status check command 70*h*. For example, when the bit received through the first input/output line DQ0, corresponding to the second status check command 78*h* is '0,' the bit represents that the most recent operation performed on the selected plane among the planes of the memory device has succeeded. For example, when the bit received through the first input/output line DQ0, corresponding to the second status check command 78*h* is '1,' the bit represents that the most recent operation performed on the selected plane among the planes of the memory device has failed.

A bit received through the second input/output line DQ1, corresponding to the second status check command 78*h*, may represent whether a previous operation performed on a selected plane among the plane 0, plane 1, plane 2, and plane 3 of the memory device has succeeded (i.e., passed) or failed. That is, the bit received through the second input/output line DQ1, corresponding to the second status check command 78*h*, may represent a status check result corresponding to one plane, unlike the bit received through the second input/output line DQ1, corresponding to the first status check command 70*h*. For example, when the bit received through the second input/output line DQ1, corresponding to the second status check command 78*h* is '0,' the bit represents that the previous operation performed on the selected plane among the planes of the memory device has succeeded. For example, when the bit received through the second input/output line DQ1, corresponding to the second status check command 78*h* is '1,' the bit represents that the previous operation performed on the selected plane among the planes of the memory device has failed.

As shown in FIG. 11, it is assumed that the memory device supports the first status check command 70*h* and the second status check command 78*h* and bits in the status information corresponding to the first status check command 70*h* and the second status check command 78*h* are defined. The memory controller may perform a status check on the memory device, using the first status check command 70*h*. It is assumed that a bit received through the first input/output line DQ© is '1' as a result obtained by performing the status check, using the first status check command 70*h*, i.e., that an operation performed on at least one plane among the planes of the memory device has failed. The memory controller may perform error processing, etc. by checking a plane in which the performed operation has failed among the planes of the memory device. Thus, the memory controller can check a plane in which the performed operation has failed among the planes of the memory device, by further performing a status check using the second status check command 78*h*.

Figure 12:
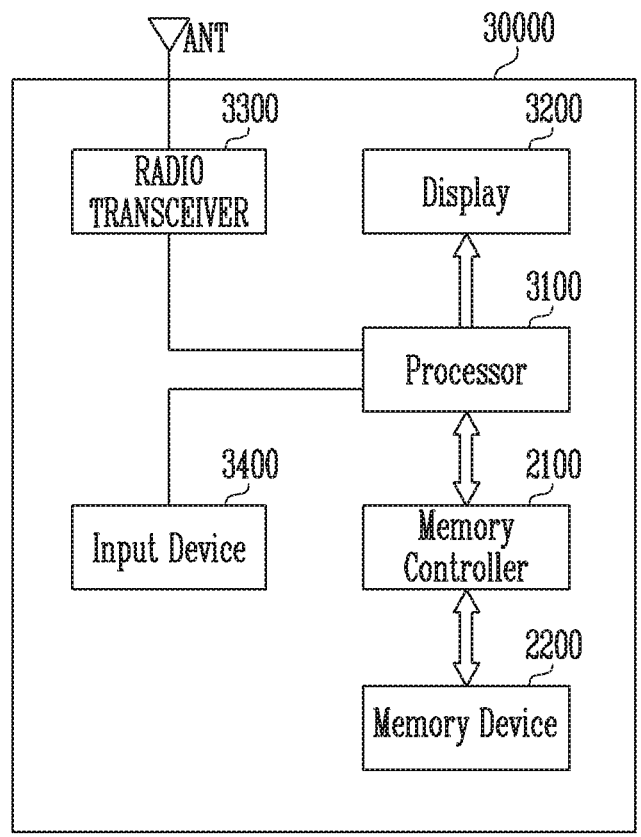
FIG. 12 is a diagram illustrating an example of the memory system including the memory controller shown in FIGS. 1 and 2.

FIG. 12 is a diagram illustrating an example of the memory system including the memory controller shown in FIGS. 1 and 2. For example, the memory system 30000 of FIG. 12 may correspond to the memory system 2000 of FIG. 1.

Referring to FIG. 12, the memory system 30000 may be implemented as a cellular phone, a smart phone, a tablet personal computer (PC), a personal digital assistant (PDA), or a wireless communication device. The memory system 30000 may include a memory device 2200 and a memory controller 2100 capable of controlling an operation of the memory device 2200. The memory device 2200 shown in FIG. 12 may correspond to the memory device 2200 shown in FIGS. 1 and 2. The memory controller 2100 shown in FIG. 12 may correspond to the memory controller 2100 shown in FIGS. 1 and 2.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 13:
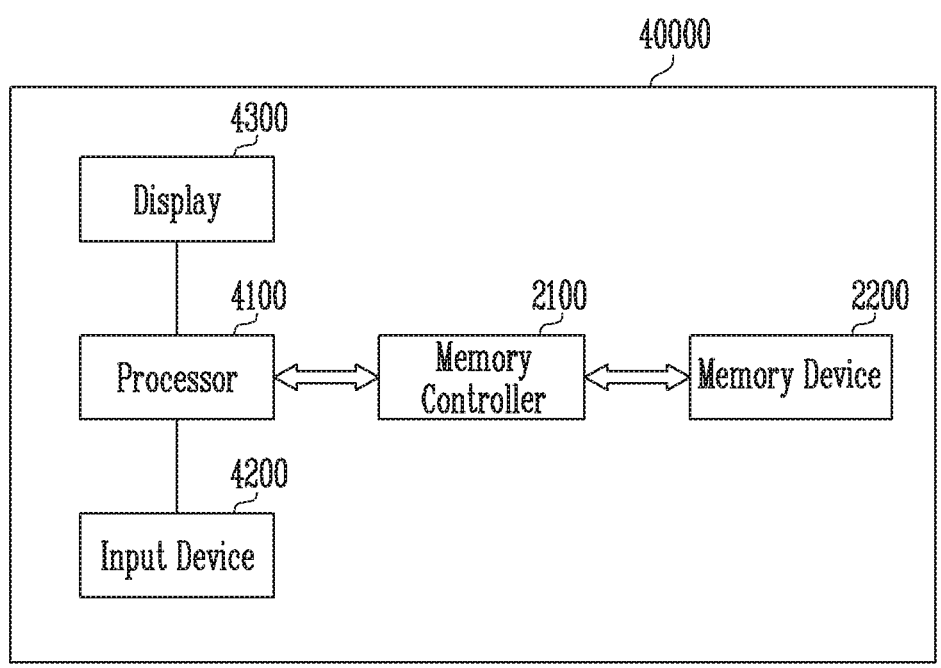
FIG. 13 is a diagram illustrating an example of the memory system including the memory controller shown in FIGS. 1 and 2.

FIG. 13 is a diagram illustrating an example of the memory system including the memory controller shown in FIGS. 1 and 2. For example, the memory system 40000 of FIG. 13 may correspond to the memory system 2000 shown in FIG. 1.

Referring to FIG. 13, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 2200 and a memory controller 2100 capable of controlling a data processing operation of the memory device 2200. The memory device 2200 shown in FIG. 13 may correspond to the memory device 2200 shown in FIGS. 1 and 2. The memory controller 2100 shown in FIG. 13 may correspond to the memory controller 2100 shown in FIGS. 1 and 2.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 14:
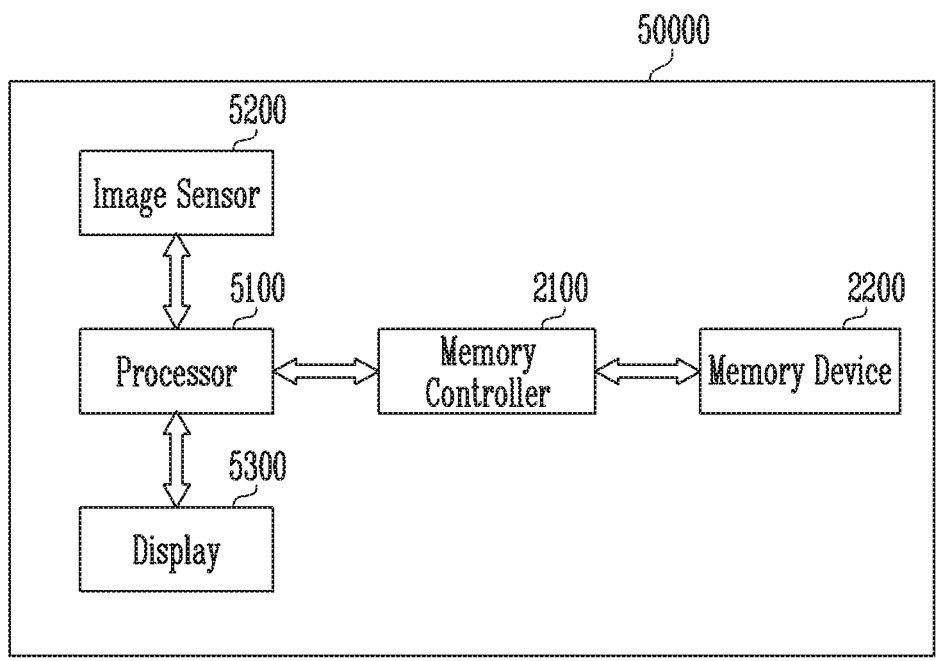
FIG. 14 is a diagram illustrating an example of the memory system including the memory controller shown in FIGS. 1 and 2.

FIG. 14 is a diagram illustrating an example of the memory system including the memory controller shown in FIGS. 1 and 2. For example, the memory system 50000 may correspond to the memory system 2000 of FIG. 1.

Referring to FIG. 14, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a memory controller 2100 capable of controlling a data processing operation of the memory device 2200, e.g., a program operation, an erase operation, or a read operation. The memory device 2200 shown in FIG. 14 may correspond to the memory device 2200 shown in FIGS. 1 and 2. The memory controller 2100 shown in FIG. 14 may correspond to the memory controller 2100 shown in FIGS. 1 and 2.

An image sensor 5200 of the memory system 50000 may convert an optical image into digital signals, and the converted digital signals may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 15:
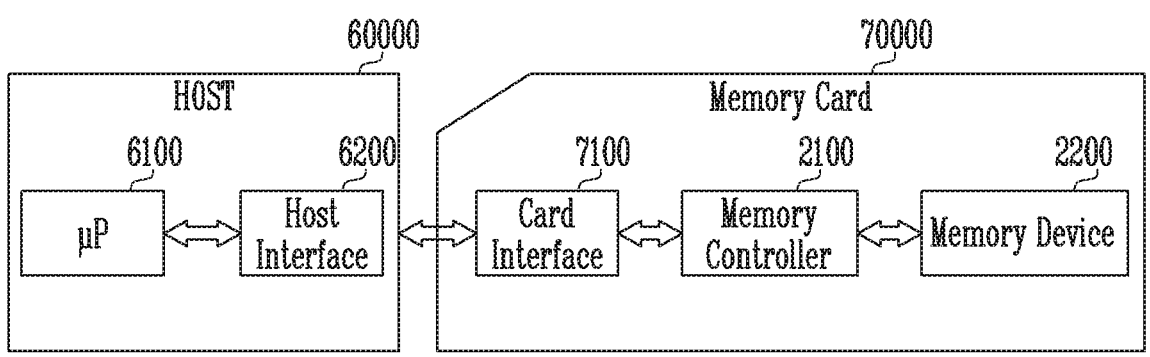
FIG. 15 is a diagram illustrating an example of the memory system including the memory controller shown in FIGS. 1 and 2.

FIG. 15 is a diagram illustrating an example of the memory system including the memory controller shown in FIGS. 1 and 2. For example, the memory system 70000 may correspond to the memory system 2000 of FIG. 1.

Referring to FIG. 15, the memory system 70000 may be implemented as a memory card or a smart card. The memory system 70000 may include a memory device 2200, a memory controller 2100, and a card interface 7100. The memory device 2200 shown in FIG. 15 may correspond to the memory device 2200 shown in FIGS. 1 and 2. The memory controller 2100 shown in FIG. 15 may correspond to the memory controller 2100 shown in FIGS. 1 and 2.

The memory controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor (µP) 6100.

According to the present disclosure, a status check can be performed according to a type of the memory device, thereby improving the reliability of the memory system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller comprising:
a status check command determining section configured to check a status check command supported by a memory device among a plurality of status check commands; and
a status check performing section configured to perform a status check operation on the memory device by using the checked status check command,
wherein the status check performing section checks a status check result by checking one or more bits in status information received from the memory device, and
wherein the one or more bits correspond to one or more reference bits which are mapped to the checked status check command.

2. The memory controller of claim 1, wherein the status check command determining section checks the status check command supported by the memory device based on type information of the memory device which is received from a host.

3. The memory controller of claim 1, wherein the status check command determining section:
stores a first table in which one or more pieces of type information of a memory device that supports each of the plurality of status check commands are recorded, wherein the one or more pieces of the type information are mapped to the corresponding status check command; and
checks the status check command supported by the memory device based on the first table and the type information of the memory device which is received from the host.

4. The memory controller of claim 1, wherein the status check performing section:
stores a second table in which definitions of bits representing the status information corresponding to each of the plurality of status check commands are recorded; and
checks the status check result based on the second table and the status information received from the memory device.

5. The memory controller of claim 1, wherein the status check performing section stores a third table in which the one or more reference bits to be checked in the status information corresponding to each of the plurality of status check commands are recorded.

6. The memory controller of claim 5, wherein, in the third table, the one or more reference bits are mapped further corresponding to each operation,
wherein the status check performing section checks a status check result by checking one or more bits corresponding to the one or more reference bits mapped to an operation on which a status check is to be performed in the status information received from the memory device.

7. The memory controller of claim 1, wherein the status check performing section:
when a plurality of status check commands are checked, performs a status check using any one status check command among the plurality of checked status check commands; and
determines whether a status check using another status check command among the plurality of checked status check commands is to be further performed, based on a result obtained by performing the status check using the one status check command.

8. A memory system comprising:
a memory device configured to output status information in response to a status check command; and
a memory controller configured to check a status check command supported by the memory device among a plurality of status check commands, and perform a status check on the memory device by using the checked status check command,
wherein the memory controller checks a status check result by checking one or more bits in the status information received from the memory device, the one or more bits corresponding to one or more reference bits which are mapped to the checked status check command.

9. The memory system of claim 8, wherein the memory controller checks the status check command supported by the memory device based on type information of the memory device which is received from a host.

10. The memory system of claim 8, wherein the memory controller:
stores a first table in which one or more pieces of type information of a memory device that supports each of the plurality of status check commands are recorded, wherein the one or more pieces of type information are mapped to the corresponding status check command; and
checks the status check command supported by the memory device based on the first table and the type information of the memory device which is received from the host.

11. The memory system of claim 8, wherein the memory controller:
stores a second table in which definitions of bits representing status information corresponding to each of the plurality of status check commands are recorded; and
checks the status check result based on the second table and the status information received from the memory device.

12. The memory system of claim 8, wherein the memory controller stores a third table in which the one or more reference bits to be checked in the status information corresponding to each of the plurality of status check commands are recorded.

13. The memory system of claim 12, wherein, in the third table, the one or more reference bits are mapped further corresponding to each operation,
wherein the memory controller checks a status check result by checking one or more bits corresponding to the one or more reference bits mapped to an operation on which a status check is to be performed in the status information received from the memory device.

14. The memory system of claim 8, wherein the memory controller:
when a plurality of status check commands are checked, performs a status check using any one status check command among the plurality of checked status check commands; and
determines whether a status check using another status check command among the plurality of checked status check commands is to be further performed, based on a result obtained by performing the status check using the one status check command.

15. A method for operating a memory controller, the method comprising:
receiving type information of a memory device from a host;

checking a status check command supported by the memory device, based on the received type information of the memory device and a first table in which one or more pieces of type information of a memory device that supports each of the plurality of status check commands are mapped to the corresponding status check command; and performing a status check on the memory device by using the checked status check command, wherein the performing of the status check includes:

receiving status information from the memory device in response to the checked status check command; and checking a status check result by checking one or more bits in the status information received from the memory device, the one or more bits corresponding to one or more reference bits which are mapped to the checked status check command.

16. The method of claim 15, wherein the checking of the status check result includes checking the status check result, based on the received status information and a second table in which definitions of bits representing status information corresponding to each of the plurality of status check commands are recorded.

17. The method of claim 16, wherein the checking of the status check result is performed with reference to a third table in which the one or more reference bits to be checked in status information corresponding to each of the plurality of check commands are mapped to the corresponding status check command.

18. The method of claim 17, wherein, in the third table, the one or more reference bits are mapped further corresponding to each operation, wherein the checking of the status check result includes checking a status check result by checking one or more bits corresponding to the one or more reference bits mapped to an operation on which a status check is to be performed in the status information received from the memory device.

19. The method of claim 15, wherein the performing of the status check includes:

when a plurality of status check commands are checked, performing a status check using any one status check command among the plurality of checked status check commands; and determining whether a status check using another status check command among the plurality of checked status check commands is to be further performed, based on a result obtained by performing the status check using the one status check command.

* * * * *